(12) United States Patent
Kim et al.

(10) Patent No.: US 7,796,432 B2
(45) Date of Patent: Sep. 14, 2010

(54) NON-VOLATILE MEMORY DEVICE AND METHOD OF OPERATING THE SAME

(75) Inventors: Won-joo Kim, Hwaseong-si (KR); Yoon-dong Park, Yongin-si (KR); June-mo Koo, Seoul (KR); Suk-pil Kim, Yongin-si (KR); Tae-eung Yoon, Seoul (KR); Tae-hee Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 165 days.

(21) Appl. No.: 12/149,213

(22) Filed: Apr. 29, 2008

(65) Prior Publication Data

US 2009/0122613 A1    May 14, 2009

(30) Foreign Application Priority Data

Nov. 12, 2007    (KR) .................... 10-2007-0114958

(51) Int. Cl.
*G11C 16/04* (2006.01)
(52) U.S. Cl. ..................... 365/185.17; 365/185.14; 365/185.15; 365/185.33
(58) Field of Classification Search ............ 365/185.17, 365/185.33, 185.05, 230.08, 185.14, 185.15
See application file for complete search history.

(56) References Cited

U.S. PATENT DOCUMENTS

| | | | | |
|---|---|---|---|---|
| 7,082,055 B2* | 7/2006 | Ichige et al. | ........... | 365/185.17 |
| 7,400,534 B2* | 7/2008 | Maejima | ............... | 365/185.17 |
| 7,411,826 B2* | 8/2008 | Ichige et al. | ........... | 365/185.17 |
| 7,605,430 B2* | 10/2009 | Lee et al. | ................... | 257/368 |
| 7,626,228 B2* | 12/2009 | Park et al. | ................... | 257/326 |

\* cited by examiner

*Primary Examiner*—Pho M Luu
(74) *Attorney, Agent, or Firm*—Harness, Dickey & Pierce, P.L.C.

(57) ABSTRACT

A non-volatile memory device may include a plurality of stacked semiconductor layers, a plurality of NAND strings, a common bit line, a common source line, and/or a plurality of string selection lines. The plurality of NAND strings may be on the plurality of semiconductor layers. Each of the plurality of NAND strings may include a plurality of memory cells and/or at least one string selection transistor arranged in a NAND-cell array. The common bit line may be commonly connected to each of the NAND strings at a first end of the memory cells. The common source line may be commonly connected to each of the NAND strings at a second end of the memory cells. The plurality of string selection lines may be coupled to the at least one string selection transistor included in each of the NAND strings such that a signal applied to the common bit line is selectively applied to the NAND strings.

20 Claims, 3 Drawing Sheets

NON-VOLATILE MEMORY DEVICE AND METHOD OF OPERATING THE SAME

PRIORITY STATEMENT

This application claims the benefit of priority to Korean Patent Application No. 10-2007-0114958, filed on Nov. 12, 2007, in the Korean Intellectual Property Office, the entire contents of which are incorporated herein in their entirety by reference.

BACKGROUND

1. Field

Example embodiments relate to a semiconductor device, and for example, to a non-volatile memory device having a three-dimensional stack structure, and/or a method of operating the non-volatile memory device.

2. Description of Related Art

Recently, due to the development of smaller-sized and higher-capacity semiconductor products, non-volatile memory devices used for such semiconductor products have become more highly integrated. Accordingly, a non-volatile memory device including a three-dimensional stack structure has been introduced in place of a conventional single layer structure.

However, in a conventional three-dimensional stack structure, connecting memory cells included in respective layers and selecting the layers is relatively difficult. For example, if a conventional three-dimensional structure is formed by using a conventional NAND cell array, as layers constituting the three-dimensional structure are further stacked, the number of word lines may increase. Therefore, because the number of circuits driving the word lines is remarkably increased, a non-volatile memory device may have a more restricted integration level.

If the conventional NAND cell array is disposed perpendicular to a semiconductor substrate, obtaining an electrical reliability of channel layers is more difficult, and therefore, obtaining electrical reliability of a non-volatile memory device is more difficult.

SUMMARY

Example embodiments provide a non-volatile memory device having a three-dimensional and/or more highly integrated stack structure.

Example embodiments provide a more reliable method of operating the non-volatile memory device having a three-dimensional and more highly integrated stack structure.

According to an example embodiment, a non-volatile memory device may include a plurality of stacked semiconductor layers, a plurality of NAND strings, a common bit line, a common source line, and/or a plurality of string selection lines. The plurality of NAND strings may be on the plurality of semiconductor layers. Each of the plurality of NAND strings may include a plurality of memory cells and/or at least one string selection transistor arranged in a NAND-cell array. The common bit line may be commonly connected to each of the NAND strings at a first end of the memory cells. The common source line may be commonly connected to each of the NAND strings at a second end of the memory cells. The plurality of string selection lines may be coupled to the at least one string selection transistor included in each of the NAND strings such that a signal applied to the common bit line is selectively applied to the NAND strings.

According to an example embodiment, the memory device may include a body bias line commonly connected to the semiconductor layers.

According to an example embodiment, each of the NAND strings may include a ground selection transistor.

According to an example embodiment, the memory device may include a ground selection line coupled to the ground selection transistor of each of the NAND strings.

According to an example embodiment, the memory device may include a plurality of word lines coupled to the memory cells of each of the NAND strings.

According to an example embodiment, the word lines may be common to memory cells which are selected from the memory cells and may be arranged in a same column of the semiconductor layers to be perpendicularly connected.

According to an example embodiment, a number of the semiconductor layers and a number of the string selection lines may be equal to each other.

According to an example embodiment, the at least one string selection transistor included in each of the NAND strings may include a first enhancement-mode transistor.

According to an example embodiment, the common bit line may be connected to the semiconductor layers by using a plurality of contact lines, and/or the first enhancement-mode transistor included in each of the NAND strings may be between the contact lines and the memory cells.

According to an example embodiment, the at least one string selection transistor included in a portion of the NAND strings may further include at least one depletion-mode transistor between the first enhancement-mode transistor and the memory cells.

According to an example embodiment, the at least one depletion-mode transistor may be included on each of the semiconductor layers, except for a lowermost layer of the semiconductor layers.

According to an example embodiment, a number of the at least one depletion mode transistor may increase towards an uppermost layer of the semiconductor layers.

According to an example embodiment, the at least one string selection transistor of a portion of the NAND strings may further include at least one second enhancement-mode transistor outside of the first enhancement-mode transistor relative to the plurality of memory cells.

According to an example embodiment, the at least one second enhancement-mode transistor may be on the semiconductor layers, except for an uppermost layer of the semiconductor layers.

According to an example embodiment, a number of the at least one second enhancement-mode transistor may decrease towards an uppermost layer of the semiconductor layers.

According to an example embodiment a method of operating a non-volatile memory device may include programming a plurality of memory cells included in a NAND string selected from a plurality of NAND strings, the plurality of NAND strings on a plurality of stacked semiconductor layers. The programming of the memory cells may include turning on an enhancement-mode transistor included in at least one string selection transistor of the selected NAND string and/or turning-off an enhancement-mode transistor included in at least one string selection transistor of each of the de-selected NAND strings.

According to an example embodiment, the programming of the memory cells may include applying a program voltage to a selected word line of a plurality of word lines coupled to the plurality of memory cells and/or applying a pass voltage to de-selected word lines of the plurality of word lines.

According to an example embodiment, the programming of the memory cells may include applying 0 V to a common bit line commonly connected to the NAND strings at first ends of the memory cells.

According to an example embodiment, the programming of the memory cells may include applying 0 V to a common source line commonly connected to the NAND strings at second ends of the memory cells.

According to an example embodiment, the method may include applying an erase voltage to a body bias line commonly connected to the semiconductor layers and applying 0 V to a plurality of word lines connected to the plurality of memory cells to erase the memory cells.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Figure 1:
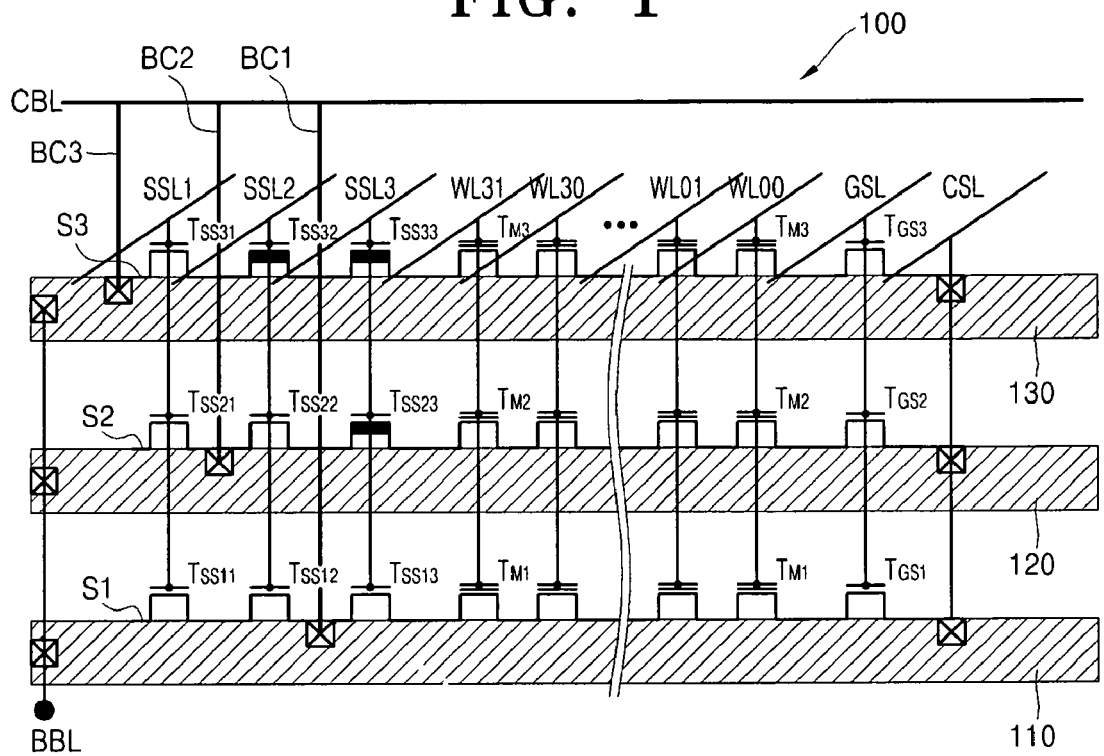
FIG. 1 is a circuit diagram of a non-volatile memory device according to an example embodiment.

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

FIG. 1 is a circuit diagram of a non-volatile memory device 100 according to an example embodiment.

Referring to FIG. 1, first, second, and/or third semiconductor layers 110, 120, and/or 130, which are sequentially stacked, may be provided. For example, the first, second, and third semiconductor layers 110, 120, and 130 may each be a single crystal layer formed of a semiconductor material or an epitaxial layer grown on the single crystal layer. For example, a stack structure of the first, second, and third semiconductor layers 110, 120, and 130 may be configured as a silicon-on-insulator (SOI) substrate, or the like. Therefore, the first, second, and third semiconductor layers 110, 120, and 130 may each be a single layer having higher quality.

First, second, and/or third NAND strings S1, S2, and/or S3 may be formed on the first, second, and third semiconductor layers 110, 120 and 130, respectively. For example, the first NAND string S1 may be formed on the first semiconductor layer 110, the second NAND string S2 may be formed on the second semiconductor layer 120, and the third NAND string S3 may be formed on a third semiconductor layer 130.

The first NAND string S1 may include at least one of first string selection transistors $T_{SS11}$, $T_{SS12}$, and $T_{SS13}$, a plurality of first memory cells $T_{M1}$, and/or a first ground selection transistor $T_{GS1}$, which are arranged in a NAND-cell array. The second NAND string S2 may include at least one of second string selection transistors $T_{SS21}$, $T_{SS22}$, and $T_{SS23}$, a plurality of second memory cells $T_{M2}$, and/or a second ground selection transistor $T_{GS2}$, which are arranged in a NAND-cell array. The third NAND string S3 may include at least one of third string selection transistors $T_{SS31}$, $T_{SS32}$, and $T_{SS33}$, a plurality of third memory cells $T_{M3}$, and/or a third ground selection transistor $T_{GS3}$, which are arranged in a NAND-cell array.

In an example embodiment, a number of the first string selection transistors $T_{SS11}$, $T_{SS12}$, and $T_{SS13}$, a number of the second string selection transistors $T_{SS21}$, $T_{SS22}$, and $T_{SS23}$, and/or the number of the third string selection transistors $T_{SS31}$, $T_{SS32}$, $T_{SS33}$ may each be equal to the number of the first, second and third semiconductor layers 110, 120 and 130. A number of the first memory cells $T_{M1}$, a number of the second memory cells $T_{M2}$, and/or a number of the third memory cells $T_{M3}$ may be appropriately determined according to a capacity of the non-volatile memory device 100, however these numbers may be equal to one another in an example embodiment.

A plurality of word lines WL00 through WL31 may be coupled to the first, second, and third memory cells $T_{M1}$, $T_{M2}$, and $T_{M3}$. For example, the word lines WL00 through WL31 may be arranged such that a first memory cell $T_{M1}$, a second memory cell $T_{M2}$, and a third memory cell $T_{M3}$, which are arranged in a same column, are perpendicularly connected, such that the first memory cell $T_{M1}$, the second memory cell $T_{M2}$ and the third memory cell $T_{M3}$ are selected from the first memory cells $T_{M1}$, the second memory cells $T_{M2}$ and the third memory cells $T_{M3}$, respectively. For example, the word lines WL00 through WL31 may each be commonly connected to the first, second, and third NAND strings S1, S2, and S3, which are sequentially stacked. Therefore, although more semiconductor layers may be stacked than in the case of an example embodiment in which the first, second and third semiconductor layers 110, 120 and 130 are stacked, the number of the word lines WL00 through WL31 need not increase. Accordingly, with regard to the stack structure according to an example embodiment, a number of circuits driving the word lines WL00 through WL31 may be almost the same as that of a conventional single layer, and/or may be remarkably reduced as compared with a conventional stack structure.

A common bit line CBL and/or a common source line CSL may be commonly connected to the first, second, and third NAND strings S1, S2 and S3. For example, the common bit line CBL may be commonly connected to the first, second, and third semiconductor layers 110, 120, and 130, at first ends of the first, second, and third memory cells $T_{M1}$, $T_{M2}$, and, $T_{M3}$. The common source line CSL may be commonly connected to the first, second, and third semiconductor layers 110, 120, and 130, at second ends of the first, second, and third memory cells $T_{M1}$, $T_{M2}$, and $T_{M3}$.

The common bit line CBL may be commonly connected to the first, second, and third semiconductor layers 110, 120, and 130 through first, second, and third contact lines BC1, BC2, and BC3, respectively. A ground selection line GSL may be commonly coupled to first, second, and third ground selection transistors $T_{GS1}$, $T_{GS2}$, and $T_{GS3}$.

First, second, and third string selection lines SSL1, SSL2, and SSL3 may be coupled to the first string selection transistors $T_{SS11}$, $T_{SS12}$, and $T_{SS13}$, the second string selection transistors $T_{SS21}$, $T_{SS22}$, and $T_{SS23}$, and/or the third string selection transistors $T_{SS31}$, $T_{SS32}$, and $T_{SS33}$, so that a signal applied to the common bit line CBL may be selectively applied to the first, second, and third NAND strings S1, S2, and S3.

For example, the first string selection line SSL1 may be commonly connected to the first, second, and third string selection transistors $T_{SS11}$, $T_{SS21}$, and $T_{SS31}$, the second string selection line SSL2 may be commonly connected to the first, second, and third string selection transistors $T_{SS12}$, $T_{SS22}$, and $T_{SS32}$, and/or the third string selection line SSL3 may be commonly connected to the first, second, and third string selection transistors $T_{SS13}$, $T_{SS23}$, and $T_{SS33}$.

The first string selection transistors $T_{SS11}$, $T_{SS12}$, and $T_{SS13}$, the second string selection transistors $T_{SS21}$, $T_{SS22}$, and $T_{SS23}$, and/or the third string selection transistors $T_{SS31}$, $T_{SS32}$, and $T_{SS33}$ may each include at least one first enhancement-mode transistor. An enhancement-mode transistor may be normally turned-off and/or may be turned-on if an on-voltage, e.g., a high voltage, is applied to a gate of thereof.

For example, the first string selection transistor $T_{SS13}$ disposed between the first contact line BC1 and the first memory cells $T_{M1}$ may be a first enhancement-mode transistor. The second string selection transistor $T_{SS22}$ disposed between the second contact line BC2 and the second memory cells $T_{M2}$ may be a first enhancement-mode transistor. The third string selection transistor $T_{SS31}$ disposed between the third contact line BC3 and the third memory cells $T_{M3}$ may be a first enhancement-mode transistor.

The second string selection transistor $T_{SS23}$ disposed between the second string selection transistor $T_{SS22}$ and the second memory cells $T_{M2}$, and/or the third string selection transistors $T_{SS32}$ and $T_{SS33}$ disposed between the third string selection transistor $T_{SS31}$ and the third memory cells $T_{M3}$ may each be a first depletion-mode transistor. A depletion-mode transistor may be normally turned-on, and therefore, the depletion-mode transistor may be similar to a conductive line in a normal state.

The second string selection transistor $T_{SS21}$ and the first string selection transistors $T_{SS11}$ and $T_{SS12}$ may each be a second enhancement-mode transistor. In another example embodiment, the second string selection transistor $T_{SS21}$ and the first string selection transistors $T_{SS11}$ and $T_{SS12}$ may each be a second depletion-mode transistor.

In the non-volatile memory device 100, at least one first depletion-mode transistor may be disposed on the second and third semiconductor layers 120 and 130, and/or not on the first semiconductor layer 110 that is disposed at the lowermost side. A number of first depletion-mode transistors may increase towards the uppermost layer. At least one second enhancement-mode transistor may be disposed on first and second semiconductor layers 110 and 120, and/or not on the third semiconductor layer 130 that is disposed at the uppermost side. A number of second enhancement-mode transistors may decrease towards the uppermost layer.

A body bias line BBL may be commonly connected to the first semiconductor layer 110, the second semiconductor layer 120, and/or the third semiconductor layer 130. Therefore, a bias voltage may be applied at least once to bodies of the first, second and third NAND strings S1, S2 and S3 via the body bias line BBL.

In the above-described non-volatile memory device 100, each of the common bit line CBL, the word lines WL00 through WL31, the first, second and third string selection lines SSL1, SSL2 and SSL3, the common source line CSL, and/or the body bias line BBL may be common to the first, second, and third NAND strings S1, S2 and S3. Therefore, the non-volatile memory device 100 may have a higher integration density.

Figure 2:
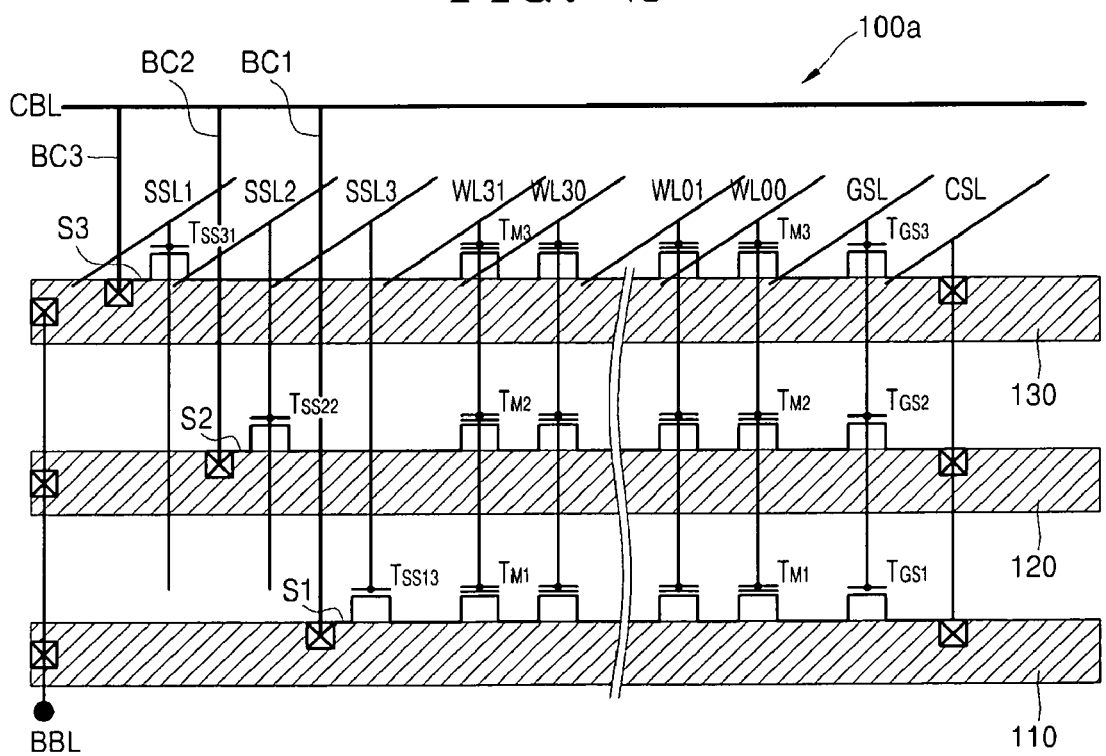
FIG. 2 is a circuit diagram of a non-volatile memory device according to another example embodiment.

FIG. 2 is a circuit diagram of a non-volatile memory device 100a according to another embodiment. For the non-volatile memory device 100a, a reference can be made to the non-volatile memory device 100 of FIG. 1, and thus its redundant description will be omitted.

Referring to FIG. 2, a first string selection transistor $T_{SS13}$, a second string selection transistor $T_{SS22}$, and/or a third string selection transistor $T_{SS31}$ may each be a first enhancement-mode transistor. For example, all of the first depletion-mode transistors and second enhancement-mode transistors, as illustrated in FIG. 1, may be omitted. According to another example embodiment, a portion of the first depletion-mode transistors or a portion of the second enhancement-mode transistors may not be omitted.

The above-described non-volatile memory devices 100 and 100a have each been described to include the first, second and third semiconductor layers 110, 120, and 130, and the first, second, and third NAND strings S1, S2 and S3. However, according example embodiments are not limited thereto, and more (or less) semiconductor layers (not shown) may be stacked than in the case of the non-volatile memory devices 100 and 100a in which the first, second, and third semiconductor layers 110, 120, and 130 are stacked, and more (or less) NAND strings (not shown) may be stacked than the non-volatile memory devices 100 and 100a in which the first, second, and third NAND strings S1, S2, and S3 are stacked.

A plurality of NAND strings may be formed on a plurality of semiconductor layers. A common bit line and a common source line may be commonly connected to the NAND strings. A plurality of word lines may be coupled to a plurality of respective memory cells of the NAND strings. The word lines may be common to memory cells, which are selected from the memory cells and/or arranged in a same column of the semiconductor layers.

A plurality of string selection lines may each be coupled to at least one string selection transistor of the NAND strings so that a signal applied to the common bit line is selectively applied to the NAND strings. A ground selection line may be coupled to each ground transistor of each of the NAND strings. A body bias line may be commonly connected to the semiconductor layers.

Hereinafter, a method of operating the non-volatile memory device 100 will be described with reference to FIGS. 3 through 5.

Figure 3:
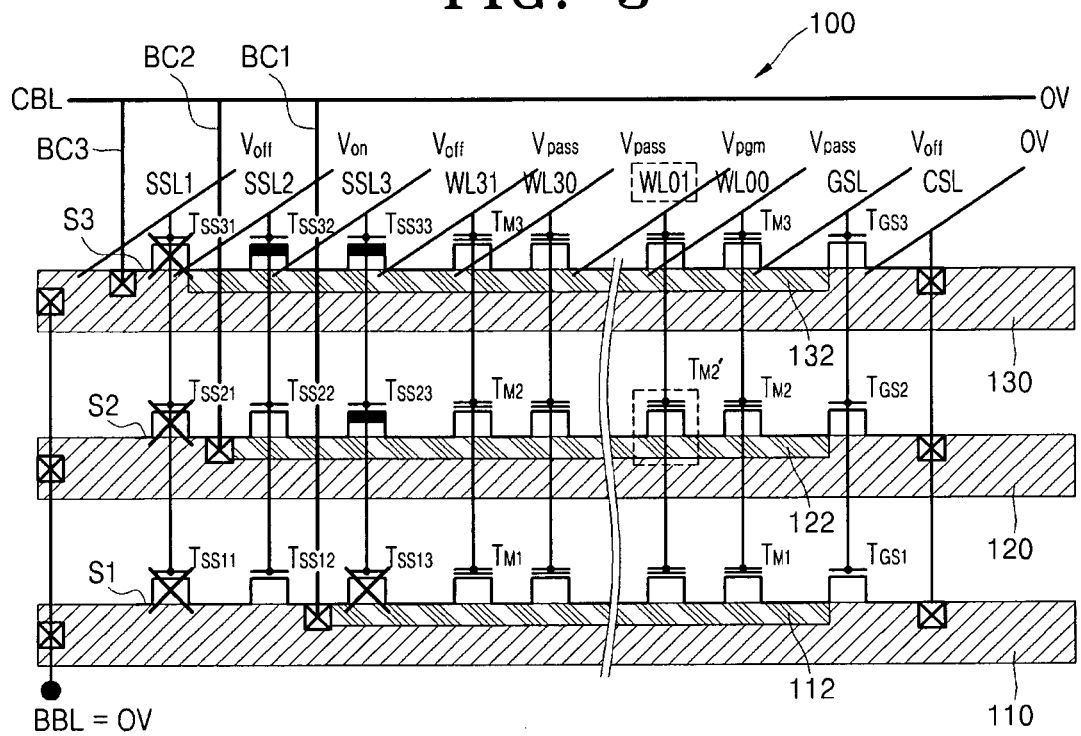
FIG. 3 is a circuit diagram illustrating a programming operation of a non-volatile memory device, according to an example embodiment.

FIG. 3 is a circuit diagram illustrating a programming operation of the non-volatile memory device 100, according to an example embodiment.

Referring to FIG. 3, an operation of a selected second memory cell $T_{M2}$' which is selected from the second memory cells $T_{M2}$ and is coupled to the second NAND string S2, will be described. An on-voltage $V_{on}$ may be applied to the second string selection line SSL2 and/or an off-voltage $V_{off}$ may be applied to the first and third selection lines SSL1 and SSL3. Therefore, the first, second and third string selection transistors $T_{SS12}$, $T_{SS22}$, and $T_{SS32}$ coupled to the second string selection line SSL2 may be turned-on. The first, second, and third string selection transistors $T_{SS11}$, $T_{SS13}$, $T_{SS21}$, and $T_{SS31}$, each of which is coupled to the first and third selection lines SSL1 and SSL3 and includes a first enhancement-mode transistor, may be turned-off.

0 V may be applied to each of the common bit line CBL, the common source line CSL, and the body bias line BBL. An off-voltage $V_{off}$ may be applied to the ground selection line GSL. Therefore, the first, second, and third ground selection transistors $T_{GS1}$, $T_{GS2}$, and $T_{GS3}$, commonly coupled to the ground selection line GSL, may be turned-off. A program voltage $V_{pgm}$ may be applied to the word line WL01 that is selected from the word lines WL00 through WL31, and/or a pass voltage $V_{pass}$ may be applied to the de-selected word lines WL00, and WL02 through W31. The program voltage $V_{pgm}$ may be greater than the pass voltage $V_{pass}$ to permit tunneling of charges.

Accordingly, a channel layer 122 of the second semiconductor layer 120 may be connected to the common bit line CBL to be charged with 0 V. Therefore, charges may be injected into a charge storage layer of the selected second memory cell $T_{M2}$', by a voltage difference between the program voltage $V_{pgm}$ and 0 V, and the selected second memory cell $T_{M2}$' may be programmed. Because channel layers 112 and 132 respectively of the first and second semiconductor layers 110 and 130 may not be connected to the common bit line CBL, the channel layers 112 and 132 may be capacitively coupled to the word lines WL00 through WL31. Therefore, the channel layers 112 and 132 may be charged with a channel boosting voltage Vcb. Accordingly, programming of the first memory cells $T_{M1}$ and the third memory cells $T_{M3}$ may be prevented.

The result of the programming operation may be generalized as shown in Table 1. The programming method described with reference to Table 1 may be applied to a non-volatile memory device including a plurality of semiconductor layers and a plurality of NAND strings.

TABLE 1

| CBL | S-SSL | N-SSL | S-WL | N-WL | GSL | CSL | BBL |
|---|---|---|---|---|---|---|---|
| 0 V | $V_{on}$ | $V_{off}$ | $V_{pgm}$ | $V_{pass}$ | $V_{off}$ | 0 V | 0 V |

For example, 0 V may be applied to the common bit line CBL, the common source line CSL, and/or the body bias line BBL. An on-voltage $V_{on}$ may be applied to a selected string selection line S-SSL, which is selected from the string selection lines, and an off-voltage $V_{off}$ may be applied to de-selected string selection lines N-SSL. A program voltage $V_{pgm}$ may be applied to a selected word line S-WL, which is selected from the word lines, and/or a pass voltage $V_{pass}$ may be applied to de-selected word lines N-WL. An off-voltage $V_{off}$ may be applied to the ground selection line GSL.

Figure 4:
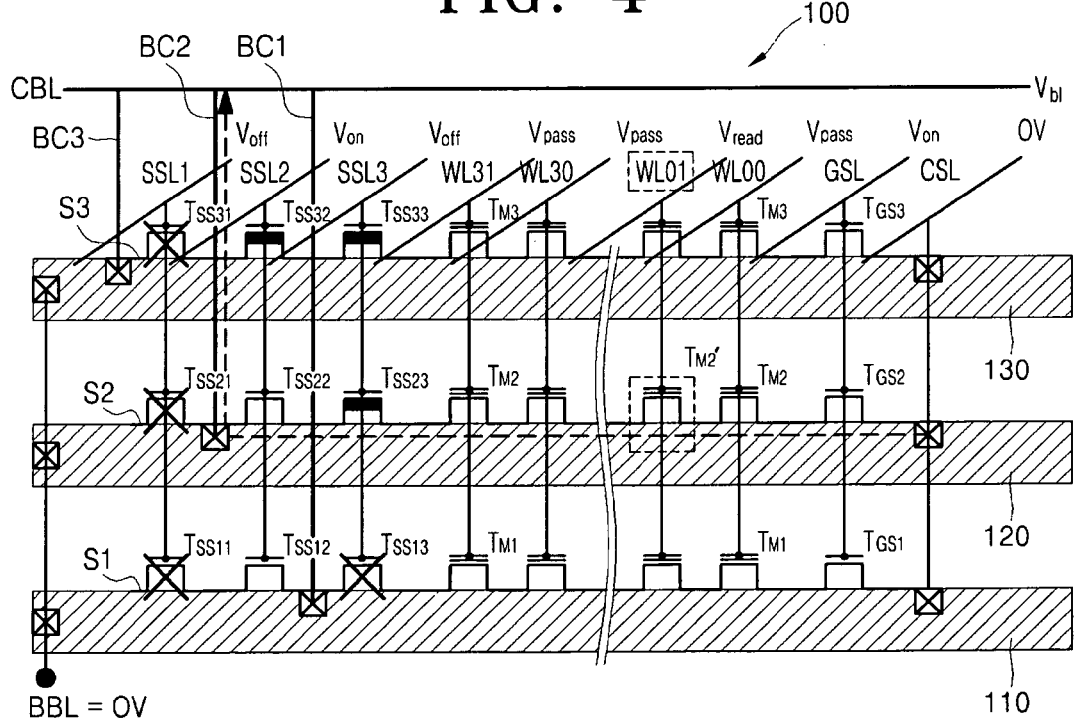
FIG. 4 is a circuit diagram illustrating a reading operation of a non-volatile memory device, according to an example embodiment.

FIG. 4 is a circuit diagram illustrating a reading operation of the non-volatile memory device 100, according to an example embodiment.

Referring to FIG. 4, the reading operation of a selected second memory cell $T_{M2}$', which is selected from the second memory cells $T_{M2}$ and is coupled to the word line WL01 of the second NAND string S2, will be described. An on-voltage $V_{on}$ may be applied to the second string selection line SSL2, and/or an off-voltage $V_{off}$ may be applied to the first and third string selection lines SSL1 and SSL3. Accordingly, the first, second, and third string selection transistors $T_{SS12}$, $T_{SS22}$, and $T_{SS32}$ coupled to the second string selection line SSL2 may be turned-on. The second and third string selection transistors $T_{SS11}$, $T_{SS13}$, $T_{SS21}$, and $T_{SS31}$, each of which is coupled to the first and third string selection lines SSL1 and SSL3 and includes a first enhancement-mode transistor, may be turned-off.

An operating voltage $V_{bl}$ may be applied to the common bit line CBL, and/or 0 V may be applied to the common source line CSL and the body bias line BBL. An on-voltage $V_{on}$ may be applied to the ground selection line GSL. Accordingly, the first, second, and third ground selection transistors $T_{GS1}$, $T_{GS2}$, and $T_{GS3}$ coupled to the ground selection line GSL may be turned-on. A reading voltage $V_{read}$ may be applied to the word line WL01 selected from the word lines WL00 through WL31, and/or a pass voltage $V_{pass}$ may be applied to the de-selected word lines WL00, and WL02 through WL31. The reading voltage $V_{read}$ may be appropriately determined so as to determine a data state of the selected second memory cell $T_{M2}$'.

If data was not programmed in the selected second memory cell $T_{M2}$', the selected second memory cell $T_{M2}$' may be turned-on, and therefore, electrons may be moved from the common source line CSL to the common bit line CBL, as indicated by an arrow in FIG. 4. For example, flow of a current may be measured from the common bit line CBL to the common source line CSL. On the other hand, if data is programmed in the selected second memory cell $T_{M2}$', the selected second memory cell $T_{M2}$' may be turned-off, and therefore, a current may not flow from the common bit line CBL to the common source line CSL.

The result of the reading operation may be generalized as shown in Table 2. The reading operation, described with reference to Table 2 may be applied to a non-volatile memory device including a plurality of semiconductor layers and a plurality of NAND strings.

TABLE 2

| CBL | S-SSL | N-SSL | S-WL | N-WL | GSL | CSL | BBL |
|---|---|---|---|---|---|---|---|
| $V_{bl}$ | $V_{on}$ | $V_{off}$ | $V_{read}$ | $V_{pass}$ | $V_{on}$ | 0 V | 0 V |

For example, an operating voltage $V_{bl}$ may be applied to the common bit line CBL, and/or 0 V may be applied to the common source line CSL and the body bias line BBL. An on-voltage $V_{on}$ may be applied to a selected string selection line S-SSL, which is selected from the string selection lines, and/or an off-voltage $V_{off}$ may be applied to de-selected string selection lines N-SSL. A reading voltage $V_{read}$ may be applied to a selected word line S-WL, which is selected from the word lines, and/or a pass voltage $V_{pass}$ may be applied to de-selected word lines N-WL. An on-voltage $V_{on}$ may be applied to the ground selection line GSL.

Figure 5:
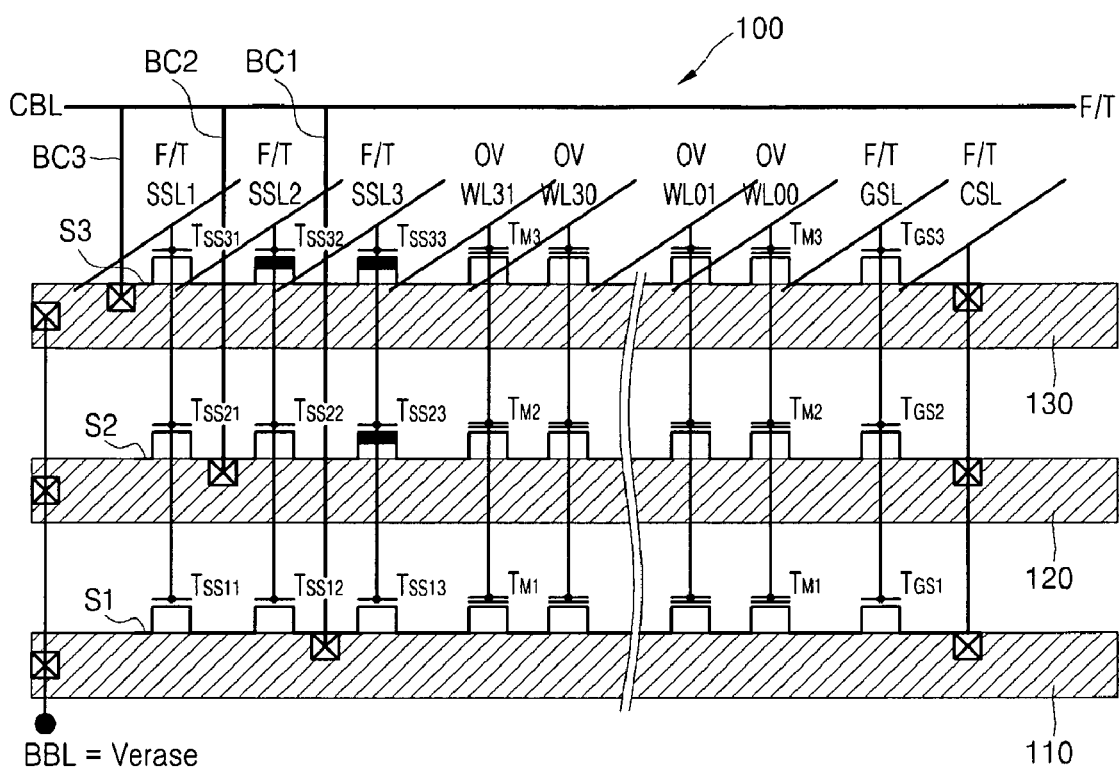
FIG. 5 is a circuit diagram illustrating an erasing operation of a non-volatile memory device, according to an example embodiment.

FIG. 5 is a circuit diagram illustrating an erasing operation of the non-volatile memory device 100 according to an example embodiment. The non-volatile memory device 100 may include a plurality of blocks, however, only a selected block selected from the blocks is illustrated in FIG. 5.

Referring to FIG. 5, an erasing operation with regard to the selected block will be described. The first, second, and third string selection lines SSL1, SSL2, and SSL3, the common bit line CBL, the ground selection line GSL, and/or the common source line CSL may be floated. 0 V may be applied to the word lines WL00 through WL31, and/or an erase voltage $V_{erase}$ may be applied to the body bias line BBL. 0 V may be applied to word lines (not shown) included in the de-selected blocks.

Accordingly, data recorded in the first, second, and third memory cells $T_{M1}$, $T_{M2}$, and $T_{M3}$ included in the selected block may be simultaneously erased. The erasing operation may be applied to a non-volatile memory device including a plurality of semiconductor layers and a plurality of NAND strings.

According to the above-described method of operating the non-volatile memory device 100, the first, second, and third NAND strings S1, S2 and S3 may be selectively accessed by controlling the first, second, and third string selection lines SSL1, SSL2, and SSL3. Therefore, the non-volatile memory device 100 may operate more reliably.

In a non-volatile memory device according to an example embodiment, a common bit line, word lines, string selection lines, a common source line, and/or a body bias line may be common to stacked NAND strings. For example, because the word lines are common to the stacked NAND strings, although the number of semiconductor layers increases, the number of driving circuits need not increase. Therefore, the non-volatile memory device may be more appropriately used in a more highly integrated and higher-capacity product.

Because the non-volatile memory device according to example embodiments may include semiconductor layers having a stack structure, SOI substrates may be used. Therefore, the non-volatile memory device according to example embodiments may have fewer problems due to the higher quality of the semiconductor layers, thereby enhancing the reliability of the non-volatile memory device.

Although example embodiments have been shown and described in this specification and figures, it would be appreciated by those skilled in the art that changes may be made to the illustrated and/or described example embodiments without departing from their principles and spirit.

What is claimed is:

1. A non-volatile memory device comprising:
a plurality of stacked semiconductor layers;
a plurality of NAND strings on the plurality of semiconductor layers, each of the plurality of NAND strings including a plurality of memory cells and at least one string selection transistor arranged in a NAND-cell array;
a common bit line commonly connected to each of the NAND strings at a first end of the memory cells;
a common source line commonly connected to each of the NAND strings at a second end of the memory cells;
a plurality of string selection lines coupled to the at least one string selection transistor included in each of the NAND strings such that a signal applied to the common bit line is selectively applied to the NAND strings; and
a plurality of word lines coupled to the plurality of memory cells of each of the NAND strings, wherein a number of the plurality of word lines is equal to a number of the plurality of memory cells included in a single NAND string.

2. The device of claim 1, further comprising:
a body bias line commonly connected to the semiconductor layers.

3. The device of claim 1, wherein each of the NAND strings includes a ground selection transistor.

4. The device of claim 3, further comprising:
a ground selection line coupled to the ground selection transistor of each of the NAND strings.

5. The device of claim 1, wherein the word lines are common to memory cells which are selected from the memory cells and are arranged in a same column of the semiconductor layers to be perpendicularly connected.

6. The device of claim 1, wherein a number of the semiconductor layers and a number of the string selection lines are equal to each other.

7. The device of claim 1, wherein the at least one string selection transistor included in each of the NAND strings includes a first enhancement-mode transistor.

8. The device of claim 7, wherein
the common bit line is connected to the semiconductor layers by using a plurality of contact lines, and
the first enhancement-mode transistor included in each of the NAND strings is between the contact lines and the memory cells.

9. The device of claim 7, wherein the at least one string selection transistor included in a portion of the NAND strings further includes at least one depletion-mode transistor between the first enhancement-mode transistor and the memory cells.

10. The device of claim 9, wherein the at least one depletion-mode transistor is included on each of the semiconductor layers, except for a lowermost layer of the semiconductor layers.

11. The device of claim 9, wherein a number of the at least one depletion mode transistor increases towards an uppermost layer of the semiconductor layers.

12. The device of claim 7, wherein the at least one string selection transistor of a portion of the NAND strings further includes at least one second enhancement-mode transistor outside of the first enhancement-mode transistor relative to the plurality of memory cells.

13. The device of claim 12, wherein the at least one second enhancement-mode transistor is on the semiconductor layers, except for an uppermost layer of the semiconductor layers.

14. The device of claim 12, wherein a number of the at least one second enhancement-mode transistor decreases towards an uppermost layer of the semiconductor layers.

15. A method of operating a non-volatile memory device, the method comprising:
- programming a plurality of memory cells connected to a plurality of word lines, and included in a single NAND string selected from a plurality of NAND strings, the plurality of NAND strings being on a plurality of stacked semiconductor layers and a number of word lines being equal to a number of memory cells included in the single NAND string,
  - wherein the programming of the memory cells includes turning on an enhancement-mode transistor included in at least one string selection transistor of the selected NAND string and turning-off an enhancement-mode transistor included in at least one string selection transistor of each of the de-selected NAND strings.

16. The method of claim 15, wherein the programming of the memory cells further includes applying a program voltage to a selected word line of the plurality of word lines coupled to the plurality of memory cells and applying a pass voltage to de-selected word lines of the plurality of word lines.

17. The method of claim 15, wherein the programming of the memory cells includes applying 0 V to a common bit line commonly connected to the NAND strings at first ends of the memory cells.

18. The method of claim 15, wherein the programming of the memory cells includes applying 0 V to a common source line commonly connected to the NAND strings at second ends of the memory cells.

19. The method of claim 15, further comprising:
- applying an erase voltage to a body bias line commonly connected to the semiconductor layers and applying 0 V to a plurality of word lines connected to the plurality of memory cells to erase the memory cells.

20. A non-volatile memory device comprising:
- a plurality of stacked semiconductor layers;
- a plurality of NAND strings on the plurality of semiconductor layers, each of the plurality of NAND strings including a plurality of memory cells and at least one string selection transistor arranged in a NAND-cell array;
- a common bit line commonly connected to each of the NAND strings at a first end of the memory cells;
- a common source line commonly connected to each of the NAND strings at a second end of the memory cells; and
- a plurality of string selection lines coupled to the at least one string selection transistor included in each of the NAND strings such that a signal applied to the common bit line is selectively applied to the NAND strings, wherein
  - the at least one string selection transistor included in each of the NAND strings includes a first enhancement-mode transistor,
  - the common bit line is connected to the plurality of stacked semiconductor layers using a plurality of contact lines, and
  - the first enhancement-mode transistor included in each of the NAND strings is between the plurality of contact lines and the plurality of memory cells.

* * * * *